United States Patent [19]

Yaniv et al.

[11] Patent Number: 4,715,685

[45] Date of Patent: Dec. 29, 1987

[54] LIQUID CRYSTAL DISPLAY HAVING POTENTIAL SOURCE IN A DIODE RING

[75] Inventors: Zvi Yaniv, Southfield; Vincent D. Canella, Birmingham; Walter E. Chapelle, Southfield; Roger W. Pryor, Bloomfield Hills, all of Mich.

[73] Assignee: Energy Conversion Devices, Inc., Troy, Mich.

[21] Appl. No.: 708,355

[22] Filed: Mar. 4, 1985

[51] Int. Cl.$^4$ .............................................. G02F 1/133
[52] U.S. Cl. .................................... 350/332; 350/333; 350/334
[58] Field of Search ............................... 350/332–334, 350/342; 340/784; 307/318; 357/76, 45, 32, 33, 59 B, 59 C, 59 D

[56] References Cited

U.S. PATENT DOCUMENTS

| | | | |
|---|---|---|---|
| 2,861,239 | 8/1956 | Gilbert ............................. | 307/318 |
| 4,251,136 | 7/1979 | Miner et al. ...................... | 340/719 |
| 4,266,898 | 10/1980 | Ovshinsky et al. ............... | 357/2 |
| 4,545,111 | 10/1985 | Johnson et al. .................. | 357/2 |
| 4,589,733 | 5/1986 | Yaniv et al. ..................... | 350/333 X |

FOREIGN PATENT DOCUMENTS 2462004 12/1975 Fed. Rep. of Germany ........ 357/32

OTHER PUBLICATIONS

Millman et al., *Electronic Devices and Circuits*, McGraw Hill Publishing Co., 1967, pp. 580–591.

*Primary Examiner*—Stanley D. Miller
*Assistant Examiner*—David Lewis
*Attorney, Agent, or Firm*—Richard M. Goldman; Marvin S. Siskind

[57] ABSTRACT

A dynamic memory array includes plural sets of spaced apart address lines and storage locations defined by cross-overs of members of the plural sets of address lines. At each storage location a charge storage means is coupled to a threshold means. The charge storage means are addressable through the threshold means by the application of selected potentials to the plural sets of address lines. The charge storage means and the threshold means can be formed as vertically arrayed, deposited, layers of semiconductor materials, and preferably from amorphous semiconductor alloys. Also disclosed is a light influencing display having an improved bidirectional threshold isolation means.

18 Claims, 26 Drawing Figures

LIQUID CRYSTAL DISPLAY HAVING POTENTIAL SOURCE IN A DIODE RING

FIELD OF THE INVENTION

The invention pertains to random access memory devices, and integrated arrays utilizing the same, and improved bidirectional threshold means and liquid crystal displays utilizing the same.

BACKGROUND OF THE INVENTION

Random access memory devices have been made by using flip-flops incorporating at least a pair of cross-coupled transistors. A flip-flop has two stable states and provides the ability to store one bit of information in binary form. Arrays of flip-flops can be addressed in a random access fashion and have been found useful as static random access memories in various types of digital systems. One disadvantage of random access memories formed out of flip-flops is that at least two cross-coupled transistors are necessary in each storage location. When such random access memories are formed as integrated structures, because at least two transistors are necessary for each storage location, the packing density which can be achieved with this technology is correspondingly limited. Additionally, the process of forming the transistors is relatively complex.

As an alternate to static random access memories incorporating flip-flops as discussed above, dynamic memory units have been formed using shift registers. In dynamic memory units, charge is stored for a predetermined period of time on a capacitor. At the end of that time interval the charge is shifted to an adjacent capacitor. The charge moves along a sequential string of capacitors from one to the next at predetermined clock intervals. When a given packet of charge has reached the end of the shift register it can be sensed and/or fed back into the other end of the register so that the corresponding bit of information will recirculate.

Dynamic storage units can be formed with a higher packing density than can static units of the type discussed above. However, dynamic memory units must generate control and clock pulses whose function is to shift the charge, corresponding to the information, sequentially from one capacitor to the next. Additionally, the amount of information that can be stored per unit area in an integrated memory unit of this type is limited by the number of stages which can be connected together in the shift register. This is in turn limited by both the size of the capacitors that can be integrated into the device and the device area occupied by the circuitry which generates the necessary clock pulses. In addition, dynamic shift registers are not randomly addressable. Information can only be accessed when it is shifted to the end of the shift register. This inability to randomly address information stored in a register can be undesirable in many types of applications.

SUMMARY OF THE INVENTION

The present invention provides a dynamic random access memory comprising readable charge storage means for storing an electrical charge and threshold means for enabling the charging of the charge storage means. The memory of the present invention further includes means for enabling the detection of the electrical charge stored in the charge storage means. The charge storage means can be a capacitor with the threshold means arranged to enable charging of the capacitor to either a positive or a negative voltage.

As further provided by the present invention, the charge storage means and the threshold means are formed as a multilayered structure of successively deposited, vertically arrayed, layers of materials. A first group of the layers forms the charge storage means which can be a capacitor. A second group of the layers provides semiconductor interaction therebetween to form the threshold means.

The threshold means of the present invention can be bidirectional threshold means formed from deposited semiconductor materials such as amorphous semiconductor alloys comprising n-i-n bidirectional threshold devices or p-i-n diodes formed in diode rings. The threshold means can also comprise, in accordance with an alternative embodiment, a pair of threshold devices, each being independently addressable and coupled together only at the charge storage means.

The invention also provides addressing means for defining unique randomly addressable storage locations. Each storage location includes charge storage means coupled to threshold means to enable the storage of electrical charge on the charge storage means. The addressing means provide for addressing each storage element in the array uniquely. When the threshold means comprises bidirectional threshold means, the addressing means can include first and second sets of spaced apart address lines. When the threshold means comprises a pair of threshold devices coupled together only at the charge storage means, the addressing means can include first, second, and third sets of address lines.

In accordance with a further alternative embodiment of the present invention, the charge storage means can include a layer of charge storage material of the type having deep traps for storing charge. The charge storage material can be, for example, silicon nitride ($Si_xN_y$).

In yet another embodiment of the present invention, the threshold means can include first and second parallel coupled branches. Each branch can include a diode and a potential source. The branches are coupled with reverse polarity so as to form a bidirectional threshold element. In one embodiment, the potential sources are formed as batteries. In another embodiment, the potential sources are formed as photovoltaic diodes.

A memory array or matrix can be formed in accordance with the present invention with discrete potential sources associated with each threshold means. In yet another embodiment of the invention, the potential sources can be shared among a plurality of threshold means.

The present invention further provides a bidirectional threshold means for establishing first and second threshold voltages of opposite polarity. The threshold means includes a first threshold device having a first threshold voltage and a second threshold device having a second threshold voltage. The first and second threshold devices are coupled together to establish first and second threshold voltages of opposite polarity. First and second potential sources coupled in series with the first and second threshold devices respectively back bias the first and second threshold devices and increase the effective absolute magnitude of the first and second threshold voltages.

The invention further provides a light influencing display comprising a plurality of pixels, at least one said pixel including a pair of electrodes, at least one of said electrodes being light transmissive, isolation means coupled to one of said electrodes to enable the selective application of driving potentials across said electrodes, and light influencing material disposed between said electrodes. The isolation means includes bidirectional threshold means for establishing first and second threshold voltages of opposite polarity. The bidirectional threshold means includes a first threshold device having a first threshold voltage and a second threshold device having a second threshold voltage. The first and second threshold devices are coupled together to establish first and second threshold voltages of opposite polarity. First and second potential sources coupled in series with the first and second threshold devices respectively back bias the first and second threshold devices and increase the effective absolute magnitude of the first and second threshold voltages.

DETAILED DESCRIPTION OF THE PREFERRED EMBODIMENTS

Figure 1:
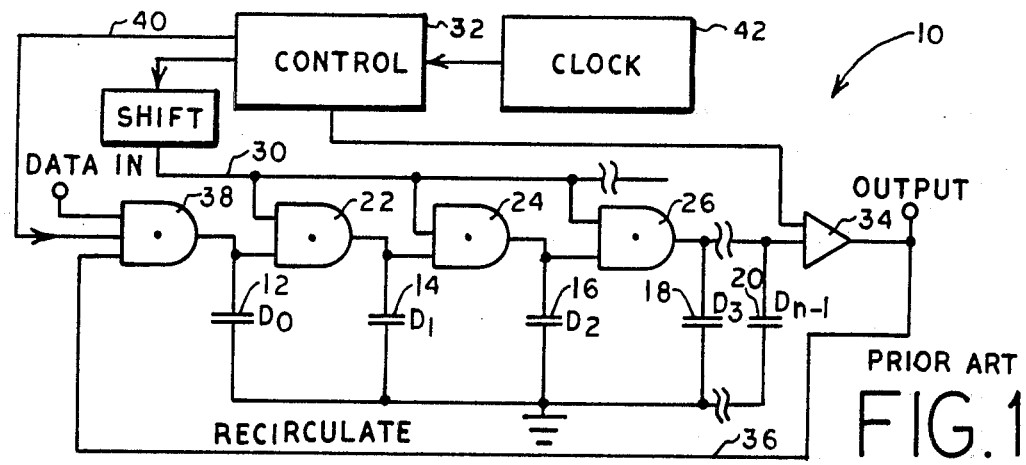
FIG. 1 is a schematic diagram of a dynamic memory unit known in the prior art.

Referring now to FIG. 1, it illustrates an example of a dynamic memory unit 10 known from the prior art. The memory unit 10 includes a plurality of capacitors, 12 through 20, which may be integrated. Each of the capacitors 12 through 20 represents a temporary storage location for a quantum of charge which is moved successively from capacitor 12 through 14 through 16 through 18 through 20 as a function of time. A plurality of AND gates 22 through 26 interconnects the capacitors 12 through 20. Each AND gate 22-26 itself includes adequate capacitance to facilitate this transfer.

Shift pulses on a line 30 which are generated by a control unit 32 in combination with the respective AND gates 22 through 26 transfer the charge on the capacitors 12 through 18 to the successive capacitors 14 through 20. An output gate 34 connects an output signal on a line 36 back to an input gate 38 for recirculating purposes. As an alternate to recirculating previously stored information, data can be input through the gate 38. The gate 38 is also connected to the control unit 32 by a line 40. Clock 42 provides signals to drive the unit 10. As can be seen from FIG. 1 the information is shifted through the string of capacitors 12 through 20 and then recirculated again to effect the storage function.

Figure 2:
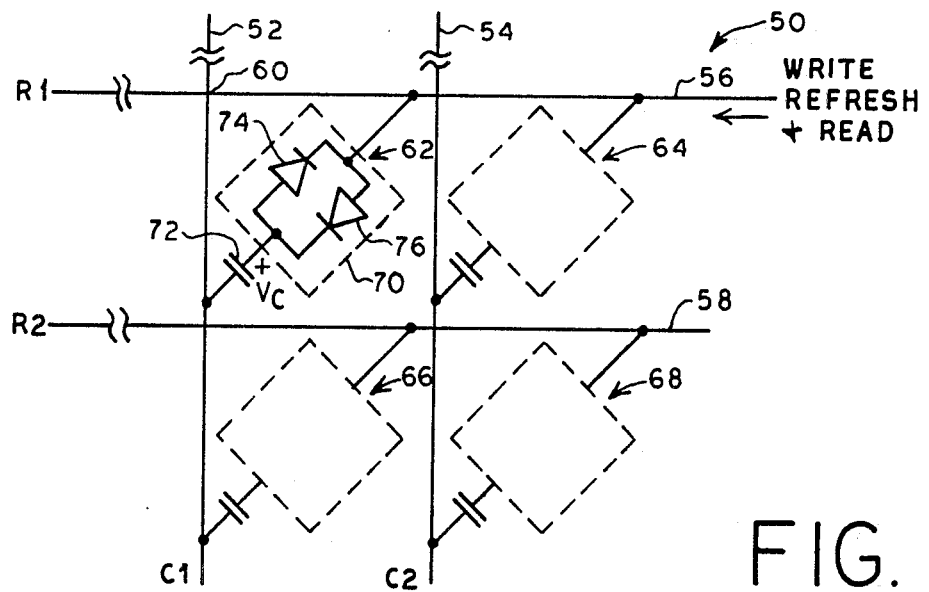
FIG. 2 is a schematic circuit diagram of a portion of a memory matrix embodying the present invention.

FIG. 2 is a fragmentary schematic circuit diagram of an array 50 embodying the present invention. The array 50 of FIG. 2 includes a first set of address lines 52 and 54, arbitrarily labeled C1 and C2. Crossing over but not connected to the first set of address lines is a second set of address lines 56 and 58, labeled R1 and R2. At the crossovers of the respective members of the first set of address lines and second set of address lines, corresponding to a crossover 60, are formed a plurality of memory storage cells 62 through 68. Each of the storage cells 62 through 68 is a dynamic memory cell which is randomly addressable. Each of the cells 62 through 68 can be addressed using corresponding address lines 52, 54 and 56, 58. Unlike the prior art dynamic memory unit of FIG. 1, the information stored in each of the cells 62 through 68 may be addressed at anytime and not just when that information is present at a down stream location, such as at the input to the gate 34 of FIG. 1.

With respect to exemplary memory cell 62, each of the memory cells includes a bidirectional threshold device 70 coupled in series with a capacitor 72. The bidirectional threshold device 70 is indicated in FIG. 2 as being formed of a diode ring having first and second diodes 74 and 76 which are coupled in parallel to one another with reverse polarity. Each of the additional memory cells 64 through 68 is identical to the memory cell 62. It will be understood that any bidirectional threshold device having a transfer function similar to that of the diode ring 70 is usable with the circuitry of the memory cells 62-68.

Figure 3A:
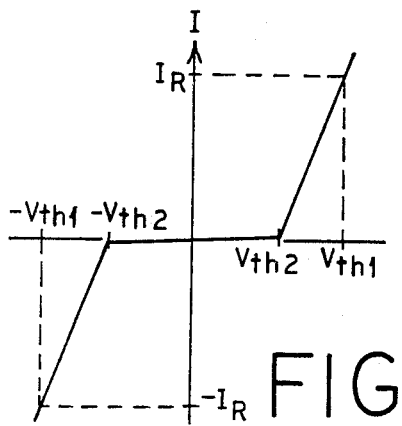
FIG. 3A is an idealized transfer function for a bidirectional threshold element of the type incorporated in the present invention.
Figure 3B:
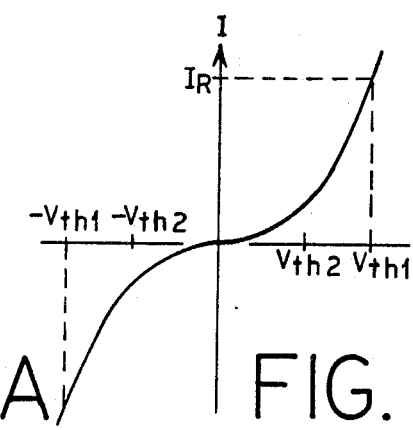
FIG. 3B is a more realistic transfer function of the same bidirectional threshold element.

FIG. 3A is an idealized transfer function for a bidirectional threshold element 70. Element 70 has a first threshold $V_{th2}$ at about half a volt, where essentially no current flows. Spaced over from the first threshold is a second voltage $V_{th1}$, at about one volt, whereat current on the order of $10^{-6}$ amps can flow. The current of $10^{-6}$ amps is indicated by $I_R$ on the transfer curve. FIG. 3B illustrates a somewhat more realistic curve which indicates that a small current, on the order of $10^{-11}$ amperes flows at $V_{th2}$. While the values of $V_{th1}$ and $V_{th2}$ are not critical, it is essential that, in accordance with this embodiment, the bidirectional threshold element 70 have a non-linear transfer characteristic in both the forward and reverse directions.

As will be described subsequently, each bidirectional threshold element can be a single threshold device having the transfer function generally shown in FIG. 3B or a pair of threshold devices, such as diodes, combined together to exhibit a transfer function as generally shown in FIG. 3B. Also, in accordance with additional embodiments to be described subsequently, the threshold means can be other than a bidirectional threshold means as illustrated in FIG. 2. For example, the threshold means can include a pair of threshold devices, such as diodes. The diodes are coupled together only at the charge storage means. Each diode is arranged to enable the charging of the charge storage means to a respective different voltage polarity.

Each threshold element or device must have the following characteristics. For voltage values greater than some voltage called $V_{on}$ (where the value of $V_{on}$ is greater than the value of $V_{off}$) the current conducted through the device is sufficient to charge the charge storage means to the desired voltage or logic level within a desired time interval. For voltage values less than some non-zero voltage value, designated as $V_{off}$, the current conducted through the device is small enough to enable the maintenance of the stored voltage on the charge storage means for sufficient time to permit reading and/or refreshing of the stored logic levels at desired time intervals.

Figure 4A:
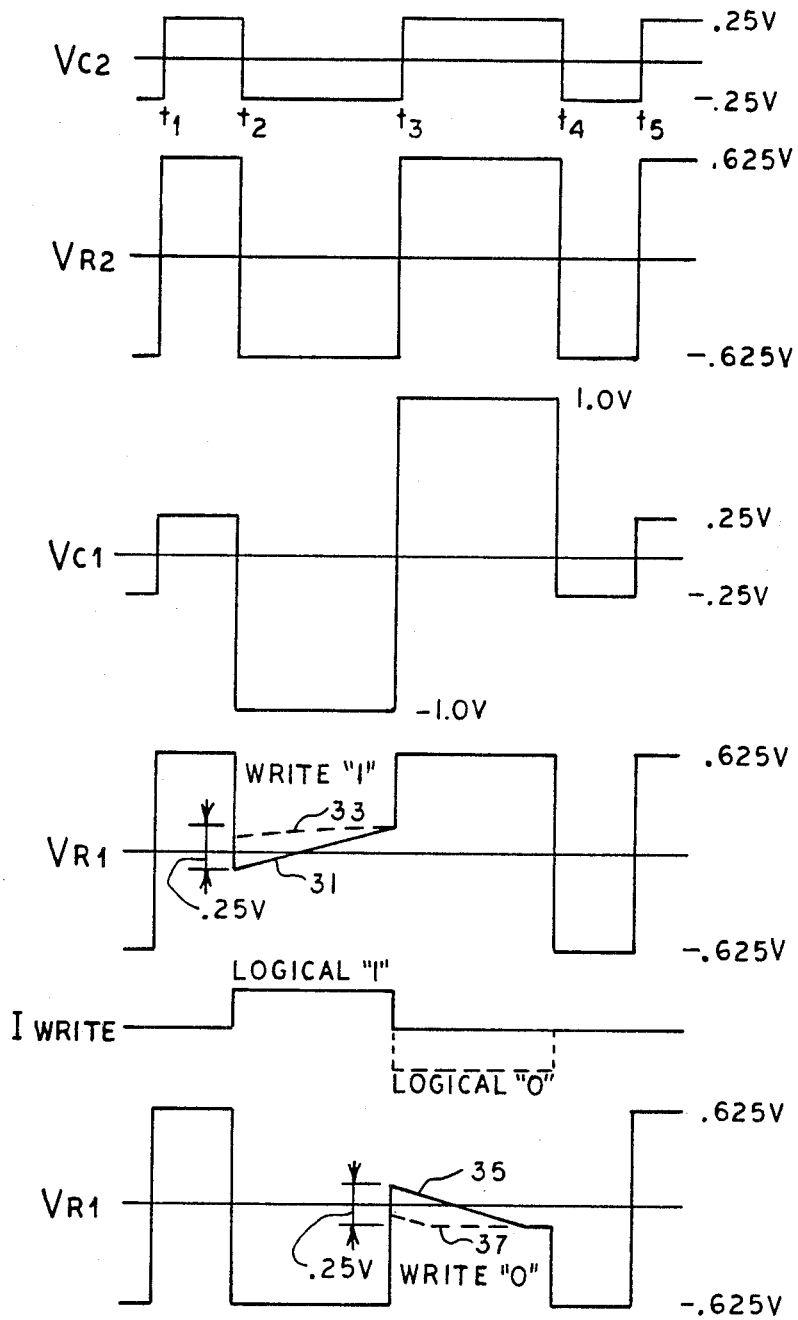
FIG. 4A is a series of waveforms associated with writing into one of the memory locations of the matrix of FIG. 2.

Referring now to FIG. 4A, it illustrates a series of waveforms associated with writing a logical "1" or a "0" into the memory element 62 located at the cross point of row line 56 and column line 52. It must first be mentioned that all memory locations which are not being written into or read and refreshed are maintained in a condition whereby the respective bidirectional threshold devices are biased at a voltage between $-V_{th2}$ and $+V_{th2}$. This avoids inadvertent forward biasing of one of the bidirectional threshold devices and maintains the currents conducted therethrough at a minimum level to assure an adequate storage time before their next read and refresh cycle.

This is accomplished by applying a $-0.25$ volts to the column lines and a $-0.625$ volts to the row lines associated with the bidirectional threshold devices during one time period and then applying a $+0.25$ volts to the column lines and a $+0.625$ volts to the row lines during the next time period. This sequence is alternated so that the bidirectional threshold devices of the memory cells not being written into or read and refreshed are maintained at a potential of plus or minus 0.375 volts. As a result, the voltage across these bidirectional threshold devices will be maintained between a $+V_{th2}$ and $-V_{th2}$. In this preferred embodiment, as previously explained, $V_{th2}$ is substantially equal to about 0.5 volts.

Referring now more particularly to FIG. 4A, between time periods $t_1$ and $t_2$ no memory cell is being written into and a $+0.25$ volts is applied to the column lines and a $+0.625$ volts is applied to the row lines. At time $t_2$, a $-1$ volt is applied to column line 52, also labeled C1. The other column lines, such as column line 54, also labeled C2, have a $-0.25$ volts applied thereto at time $t_2$. It can also be seen that a $-0.625$ volts is applied to the row line 58, also labeled R2, at time $t_2$.

During the time period beginning at $t_2$ and ending at $t_3$ a positive write current is applied to row line 56, also labeled R1 to write a logical "1" into the addressed memory cell. This write current causes the capacitor 72 to charge towards a positive voltage. By the end of the write period, at $t_3$, a positive voltage of about 0.125 volts will appear at the row line 56. If the memory cell 62 had been previously written with a logical "0," the voltage will increase at line 56 as indicated by the solid line 31 of FIG. 4A. However, if the memory cell 62 had previously been written with a logical "1," the voltage at line 56 will change during the time period $t_2$ and $t_3$ as shown by the dashed line 33. During the time period between $t_2$ and $t_3$ any memory cell coupled to column line 52 could be written with a logical "1" as discussed above. Hence, parallel writing is made possible.

The waveforms of FIG. 4A also depict the writing of a logical "0" into memory cell 62 during the time period beginning at $t_3$ and ending at $t_4$. During this time period it can be noted that the other column and row lines not associated with memory cell 62 have applied thereto a $+0.25$ volts on the column lines and a $+0.625$ volts on the row lines. To write a logical "0" into memory cell 62, a $+1.0$ volt is applied to column line 52 and a negative current is applied to the row line 56. This write current causes the capacitor 72 to be charged in the negative direction and the voltage at the row line 56 will decrease from its positive logical "1" level to a $-0.125$ volts as shown by the solid line 35 of FIG. 4A. If the memory cell 62 had previously been written with a logical "0," then the voltage on the row 56 would change as shown by the dashed line 37 of FIG. 4A. Again, any one of the memory cells associated with column line 52 could be written with a logical "0" along with the writing of memory cell 62. As a result, at $t_4$ the writing of all of the memory cells associated with column line 52 is completed and the foregoing sequence can be repeated for another column line.

Figure 4B:
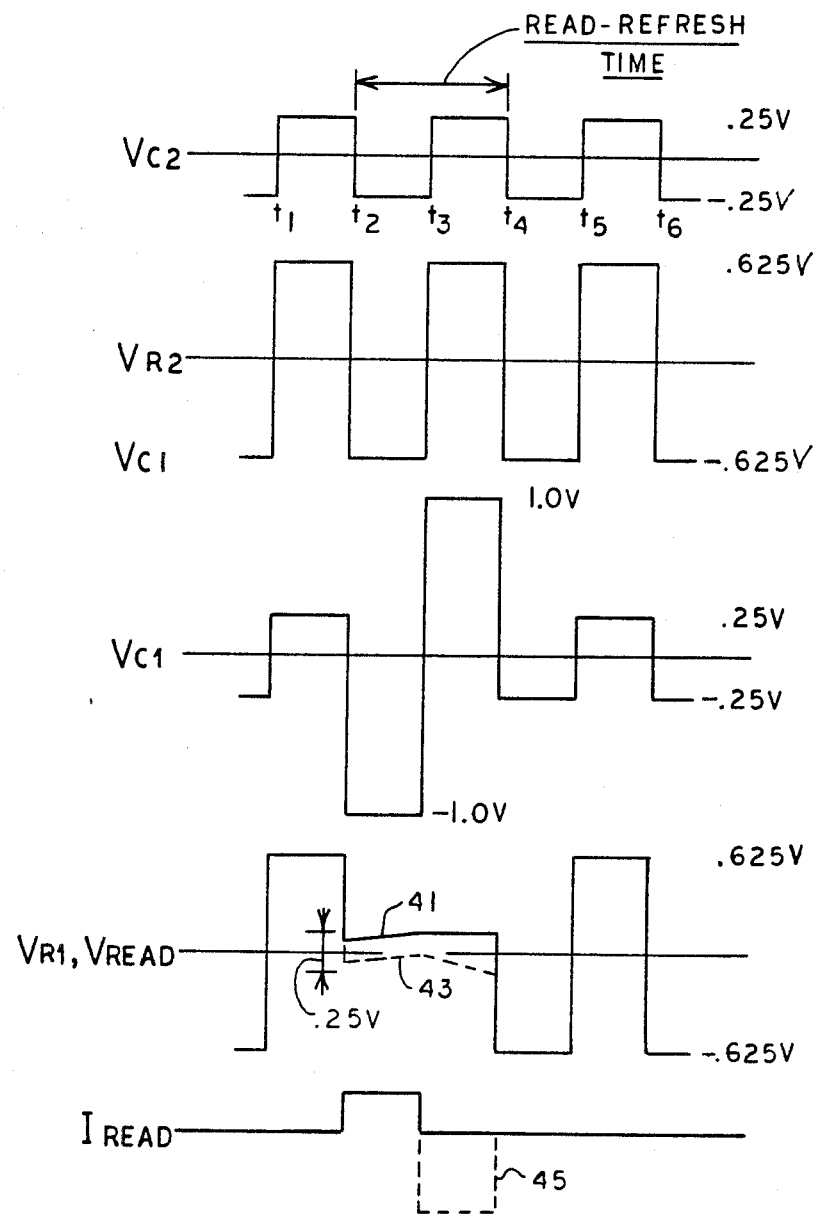
FIG. 4B is a series of waveforms associated with reading and refreshing one of the memory locations of the matrix of FIG. 2.

Referring now to FIG. 4B, it illustrates a series of waveforms associated with reading and refreshing the memory cell 62 of FIG. 2. As illustrated, the memory cell 62 is being read during the time period beginning at $t_2$ and ending at $t_3$ and being refreshed during the time period beginning at $t_3$ and ending at $t_4$.

Throughout the read and refresh cycle of memory cell 62 the columns not associated with memory cell 62 receive an applied voltage alternating between $-0.25$ volts and $+0.25$ volts during alternate time periods and the rows not associated with memory cell 62 received an applied voltage alternating between $-0.625$ volts and $+0.625$ volts during alternate time periods. At time $t_2$ when memory cell 62 is to be read, a $-1$ volt is applied to column 52 and positive read current is applied to row 56 identified as $I_{READ}$ in FIG. 4B. With a $-1$ volt applied to column 52 and the positive read current applied to row 56, and assuming that a logical "1" is stored in the memory cell 62, the read voltage on row 56 will appear as illustrated by the solid line 41.

If a logical "0" is stored in the memory cell 62, the voltage on row 56 will appear as illustrated by the dashed line 43 in FIG. 4B. The difference between the voltages of a logical "1" and a logical "0" as illustrated is 0.25 volts less any loss of charge since the last read and refresh cycle. This difference can be detected for purposes of refreshing the memory cell.

If the memory cell is storing a logical "0," a negative refresh current is applied between time periods $t_3$ and $t_4$ as shown by the dashed lines 45 to cause the capacitor 72 to be charged in the negative direction. Preferably, the refresh current magnitude is twice that of the read current magnitude so as to restore the logical "0" level in memory cell 62 to its proper value. If the memory cell 62 is storing a logical "1," then the current applied to the row line 56 is terminated at $t_3$ because the read current has already refreshed the memory cell to its proper value.

Figure 5:
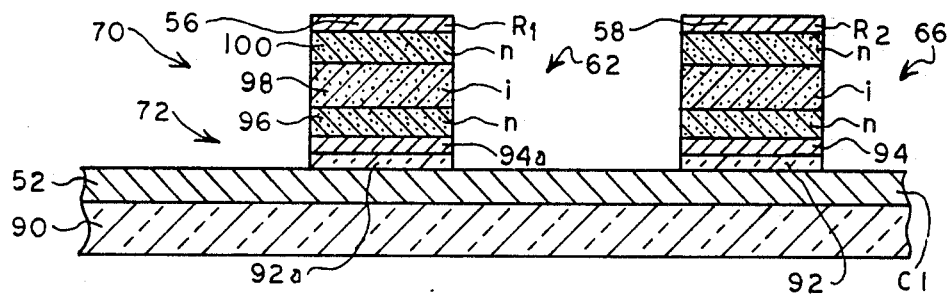
FIG. 5 is a view in section of two of the memory locations of the matrix of FIG. 2.

FIG. 5 illustrates a sectional view of part of the array 50 and a sectional view of the structure of the memory element 62. The array 50 is formed on a substrate 90 which may be glass or any other suitable insulator. The address or select line 52 is carried on a surface of the substrate 90 and may be formed of tantalum. A tantalum layer can be applied over the substrate 90 and etched using photolithography to form a plurality of spaced apart address lines such as the line 52. The tantalum layer 52 is then oxidized to form $Ta_2O_5$ pads which are shown as pads 92, 92a on top of the address line 52. Chromium pads 94, 94a are then formed above the oxidized pads 92, 92a. The capacitor 72 is formed at the crossover of the metal address line 52 and the chromium pad 94a. A region 92a of tantalum oxide is positioned therebetween and forms the dielectric of the capacitor 72.

Above the chromium pad 94a is formed the bidirectional threshold device 70. As illustrated in FIG. 5 the element 70 can be, for example, a three layer 96, 98, and 100 n-i-n device. Such devices are disclosed in U.S. patent application Ser. No. 603,852, filed Apr. 25, 1984 and entitled "Programmable Semiconductor Switch For A Display Matrix Or The Like And Method Of Making Same" which application is assigned to the assignee of the present invention. The disclosure of said patent application is hereby incorporated by reference.

The layers 96, 98, and 100 are preferably formed from deposited semiconductor material. The deposited semiconductor material is preferably an amorphous semiconductor alloy including silicon. The amorphous silicon alloy can also include hydrogen and/or fluorine and can be formed by, for example, plasma-assisted chemical vapor deposition i.e. glow discharge as disclosed, for example, in U.S. Pat. No. 4,226,898 to S. R. Ovshinsky et al for, "Amorphous Semiconductors Equivalent To Crystalline Semiconductors Produced By A Glow Discharge Process," the disclosure of which patent is incorporated herein by reference. By the term "amorphous" is meant an alloy or material which has long-range disorder, although it may have short or intermediate order or even contain at times some crystalline inclusions.

The n-i-n device 70 disclosed above has a transfer function corresponding to FIG. 3B and idealized in FIG. 3A. While not a diode ring, the n-i-n device 70 will function as a bidirectional threshold element.

The n layer 100 is covered by the address line 56. Adjacent the memory cell 62 on the address line 52 is formed the memory cell 66. The structure of the memory cell 66 is identical to the structure of the cell 62.

The capacitor 72 formed by the tantalum address line 52, the oxide layer 92a and the adjacent chromium pad 94a is on the order of 20 microns by 20 microns. This provides a capacitance of about 1 picofarad. If a greater capacitance is desired, the area of the layers 92a and 94a can be made larger.

The structure of FIG. 5 can be formed by first applying a tantalum layer over the substrate 90. The tantalum layer can be patterned using photolithography to form a plurality of parallel spaced apart address lines such as 52 and 54. The tantalum layer can then be anodized to form a $Ta_2O_5$ layer. A layer of chromium can then be deposited over the $Ta_2O_5$ layer. Using a second mask, the chromium layer and the $Ta_2O_5$ layer can be patterned to form the pads 92, 94 and 92a, 94a. Then an n-doped layer of amorphous semiconductor alloy material, an intrinsic, essentially undoped, layer of amorphous semiconductor alloy material and a second n-doped layer can be deposited over the pads and address lines. The entire multilayer structure can then be covered by a final metal layer. Using a third mask, the final metal layer and the n-i-n layers can be etched away so as to form the storage element 62 shown in FIG. 5.

Figure 6:
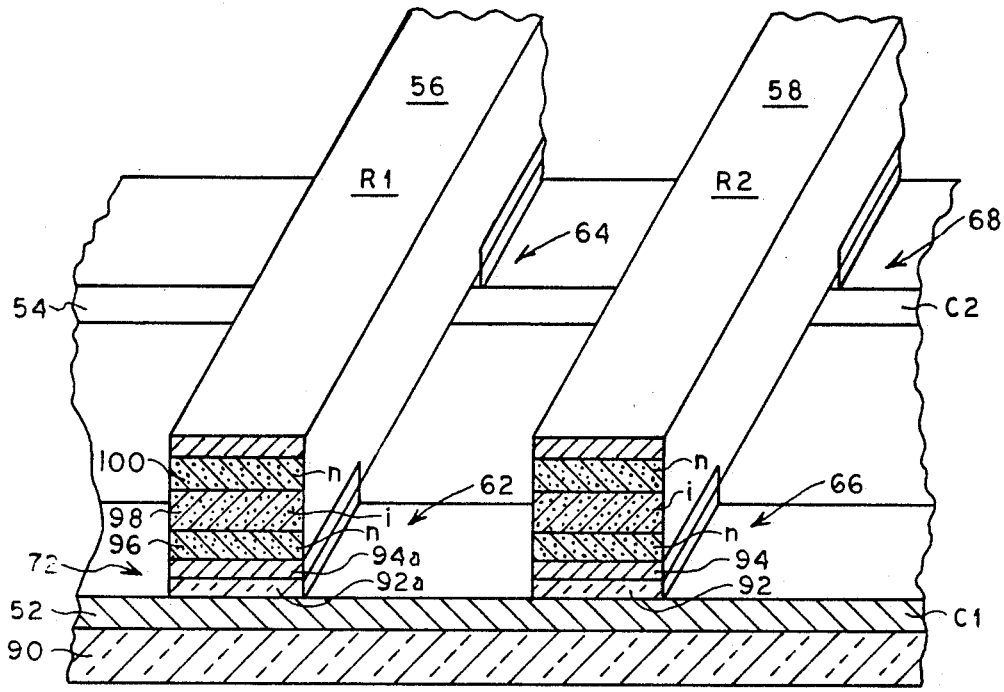
FIG. 6 is a fragmentary view in perspective of several storage locations of the matrix of FIG. 2.

FIG. 6 illustrates a perspective view of a fragment of the matrix of FIG. 2. In FIG. 6 the substrate 90 is shown with the tantalum address lines 52, 54 formed thereon. The layers 52 and 54 are each shown with oxidized top pads such as 92, 92a. The storage element 62 is shown formed vertically above a pad 92a of the tantalum oxide. The storage element 62 includes the chromium pad 94a, the n-doped layer 96, the intrinsic layer 98 and the n-doped layer 100. The layer 100 is covered by the address line 56. As can be seen from FIG. 6, the address lines 56 and 58 are spaced apart from one another and crossover the address lines 52, 54 with the storage element 62 positioned therebetween.

The structure of each of the memory locations 62-68 as can be seen in FIG. 6, is a vertical structure resulting in a very high packing density. The bidirectional threshold elements, such as 70, and the readable charge storage elements, such as capacitor 72 are vertically arrayed with respect to the corresponding address lines 52, 56. The address lines 52, 56 are positioned on opposite sides of the multilayer structure containing threshold element 70 and capacitor 72. Another advantage of the memory unit, such as 62 of FIG. 6, is that refreshing of the charge stored on the capacitor 72 occurs with respect to the same capacitor and the information is not shifted from one capacitor to another for refresh purposes.

Each of the memory locations, such as the location 62, is a multilayered structure with each bidirectional threshold element, such as 70, being a multilayered structure of successively deposited vertically arrayed layers, such as 96-100, of various materials. A first group of the layers, such as layers 52, 92a and 94a forms the charge storage capacitor 72. A second group of layers 96, 98, 100, combine to provide semiconductor interaction to form the bidirectional threshold element 70.

Figure 7:
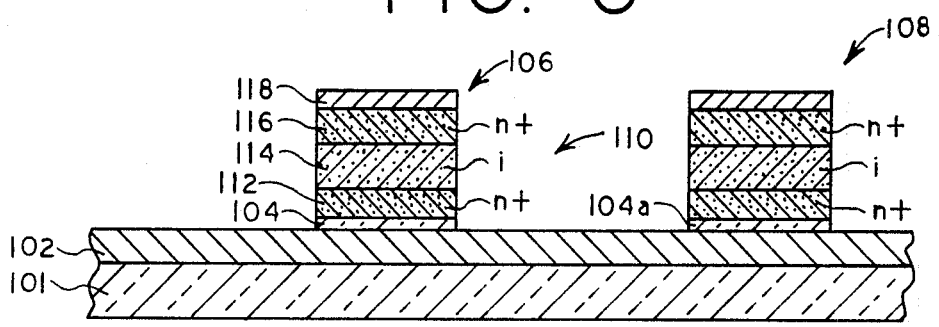
FIG. 7 is a view in section of an alternate embodiment of the present invention.

FIG. 7 illustrates an alternate embodiment of the present invention. In FIG. 7 an insulating substrate 101 has a tantalum address line 102 formed thereon. A top surface of the address line 102 has been oxidized and patterned to form oxide pads 104, 104a. Positioned on the oxidized pads 104 and 104a are first and second storage elements 106 and 108. The element 106 is formed with an amorphous semiconductor alloy three layer bidirectional threshold device 110 having a highly doped layer 112 of n-type conductivity, an intrinsic amorphous semiconductor alloy layer 114 formed over the n-plus layer 112 and a second highly doped layer 116 of n-type conductivity formed over the intrinsic layer 114. A second address line 118 of metal covers the n-plus amorphous semiconductor alloy layer 116. The device 110 of FIG. 7 operates as a bidirectional threshold element as do the corresponding devices in FIGS. 5 and 6. In the embodiment of FIG. 7 the doped layer 112 functions as one contact or plate of the charge storage capacitor as well as a region of the threshold device 110.

Figure 8:
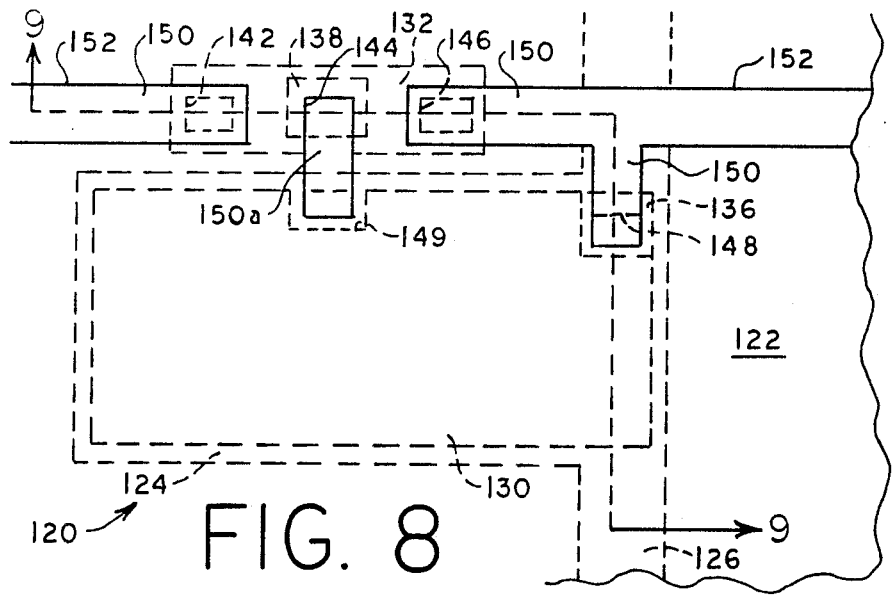
FIG. 8 is a top plan view of another memory location embodying the present invention.
Figure 9:
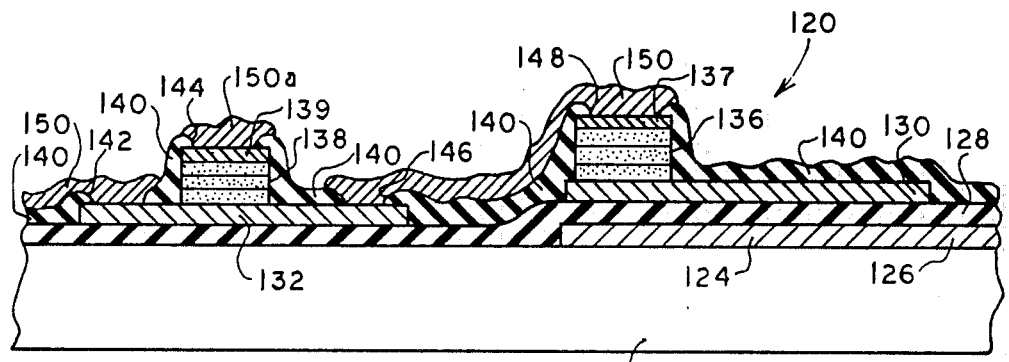
FIG. 9 is a view in section taken along line 9-9 of FIG. 8.

Referring now to FIGS. 8 and 9, they illustrate another memory cell or location 120 embodying the present invention. Here, the bidirectional device is formed from a pair of p-i-n diodes which are coupled together as illustrated in FIG. 2. The memory cell 120 of FIG. 8 is formed on an insulative substrate 122, such as glass, for example. Formed on the glass substrate 122 is a first metal layer of chromium 124 which forms a first electrode of the charge storage means or capacitor of the cell 120 and also a column address line in the region indicated at 126. Formed over the chromium 124 is a layer of dielectric material 128 which can be, for example, silicon dioxide. The dielectric 128 forms the dielectric layer of the capacitor or charge storage means of the memory cell 120. Alternatively, the layer 124 could be formed from tantalum as previously described and the dielectric layer 128 could be provided by anodizing a portion of the tantalum to form $Ta_2O_5$. Over the dielectric 128 is formed a second metal layer 130 which can also be formed from chromium. The layer 130 forms the second electrode of the capacitor or charge storage means of the memory cell 120.

Formed on the dielectric layer 128 is a conductive pad 132 which can also be formed from chromium. Formed on the metal layer 130 is a diode 136 and formed on the metal pad 132 is a second diode 138. The diodes 136 and 138 are preferably formed during the same deposition process and comprise a p-type region, an intrinsic region, and an n-type region. The diodes 136 and 138 are also preferably formed from deposited semiconductor materials and most preferably amorphous semiconductor alloys as disclosed, for example, in the aforementioned U.S. Pat. No. 4,226,898. The diodes 136 and 138 also include a top metal layer 137 and 139 formed from chromium, for example, to provide a good ohmic contact with the diodes.

The memory cell 120 further includes insulating layer regions 140. The insulating layer regions 140 can be formed from any deposited insulator such as silicon oxide or silicon nitride. During the photolithography step in forming the regions 140, openings or vias 142, 144, 146, 148, and 149 can be formed therein to expose surface portions of the diodes and the metal layers to allow a top metal layer having separate regions 150, 150a to interconnect the diodes and the metal layer 130 to form the bidirectional threshold device in series with the capacitor formed by the metal layers 124 and 130 and the dielectric layer 128. The top metal 150 not only serves to interconnect the diodes and the capacitor, but in addition can also be used to form the row address lines in portions thereof indicated at 152.

Figure 10:
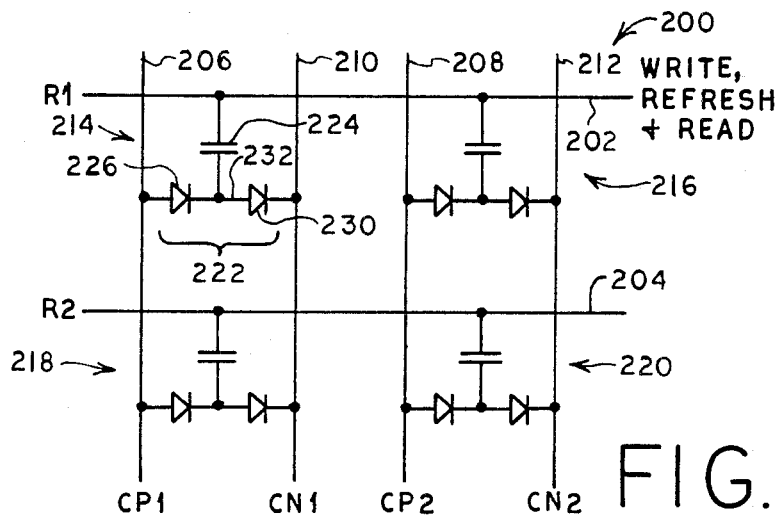
FIG. 10 is schematic of a portion of another memory matrix embodying the present invention.

Referring now to FIG. 10, it illustrates in fragmentary schematic circuit diagram form another dynamic memory matrix 200 embodying the present invention. The array 200 includes a first set of address lines 202 and 204 arbitrarily labeled R1 and R2. Crossing over but not connected to the first set of address lines are a second set of address lines 206 and 208 arbitrarily labeled CP1 and CP2 and a third set of address lines 210 and 212 arbitrarily labeled CN1 and CN2.

The first set of address lines 202 and 204 comprise the row select address lines and the second and third sets of address lines comprise the column address lines. At the crossovers of the respective members of the first set of address lines and the second and third sets of address lines are formed a plurality of memory storage cells 214, 216, 218, and 220. Each of the storage cells 214–220 is a dynamic memory cell which is randomly addressable. Each of the cells 214 through 220 can be addressed using one of the row select lines with a corresponding pair of the column address lines.

With respect to an exemplary memory cell 214, each of the memory cells includes a threshold means 222 coupled to a charge storage means such as a capacitor 224. In accordance with this preferred embodiment, the threshold means 222 comprises a pair of threshold devices, such as diodes 226 and 230. The diodes 226 and 230 are coupled together only at the capacitor 224 at a common terminal 232 and to a respective one of the column address lines at their opposite terminals. As a result, one of the diodes is arranged for charging the capacitor to a first polarity and the other diode is arranged for charging the capacitor to a second polarity wherein the first and second polarities are opposite in potential. Each of the additional memory cells 216, 218, and 220 is identical to the memory cell 214.

Figure 11A:
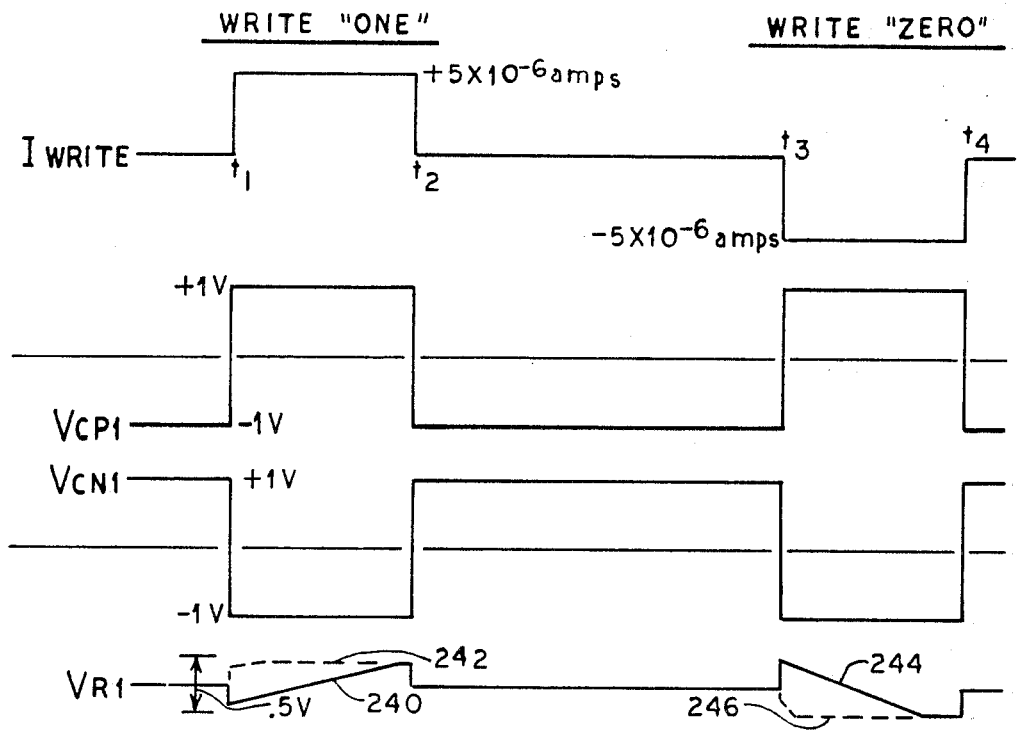
FIG. 11A is a series of waveforms associated with writing into one of the memory locations of the matrix of FIG. 10.

Referring now to FIG. 11A, the waveforms there shown illustrate a manner in which a logical "1" or a logical "0" can be written into the memory cells of FIG. 10. If a logical "1" is to be written into memory cell 214 at $t_1$, a +1 volt is applied to address line 206, a −1 volt is applied to address line 210, and a positive write current is applied to the row address line 202. As a result of the foregoing, the diodes 226 and 230 will be forward biased to permit the charging of the capacitor 224 in a positive direction. If the memory cell 214 had previously not been written into or had a logical "0" stored therein, the voltage on the row address line 202 will follow the solid line 240.

If memory cell 214 had previously been written with a logical "1," the voltage at the row address line 202 would follow the dashed line 242. As can be noted in FIG. 11A, the voltage on the row address line 202 is permitted to rise to a voltage of 0.250 volts which denotes a logical "1." At $t_2$ the voltages applied to the column address lines 206 and 210 are reversed in polarity to back bias diodes 226 and 230 leaving a positive charge remaining on the capacitor 224 for storing a logical "1" therein. To write a logical "0" into memory cell 214 at $t_3$, a +1 volt is applied to the column address line 206, a −1 volt is applied to the column address line 210, and a negative write current is applied to the row address line 202. Again, the diodes 226 and 230 are forward biased and permit the capacitor 224 to be charged in a negative direction to −0.250 volts for storing a logical "0" in memory cell 214. If memory cell 214 had previously not been written into or had been written with a logical "1" the voltage at the row line 202 will follow the solid line 244. If memory cell 214 had been written with a logical "0," the voltage at line 202 would follow the dashed line 246.

As can be seen from the foregoing, a logical "1" is represented by a +0.250 volts and a logical "0" is represented by a −0.250 volts. As a result, the difference in voltage between the two logic levels is 0.5 volts which is readily readable for determining the logic state of a memory cell.

During the writing into of the memory cell 214, all of the column address lines not associated therewith have voltages applied thereto for back biasing the diodes associated with the memory cells corresponding to the other column address lines. These diodes can be back biased by applying a −1 volt to one column address line and a +1 volt to the other address line to assure that the diodes are back biased. Also, since the same voltages are applied to the pair of column address lines 206 and 210 regardless of whether a logical "1" or logical "0" is being written into the memory cell 214, it can be realized that each memory cell having column address lines 206 and 210 in common can be written into in parallel. Furthermore, the memory cells common to these column address lines can be parallel written with either a logical "1" or a logical "0" simultaneously to allow an entire column to be written into during the same write period.

Figure 11B:
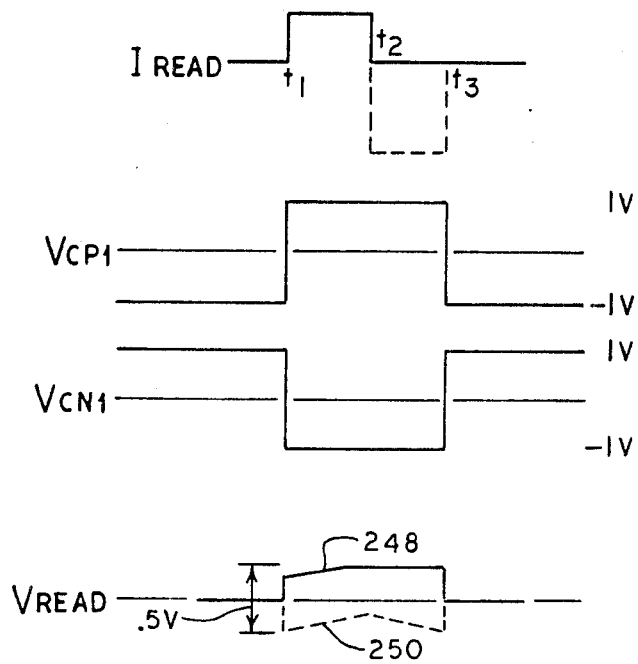
FIG. 11B is a series of waveforms associated with reading and refreshing one of the memory locations of the matrix of FIG. 10.

Referring now to FIG. 11B, the waveforms there shown illustrate the manner in which a memory cell is read and refreshed. Again, particular reference is made to memory cell 214 of FIG. 10. To read memory cell 214, at time $t_1$, a +1 volt is applied to column address line 206 and −1 volt is applied to column address line 210. These applied voltages forward bias the diodes 226 and 230 to permit a read voltage to be read on the row address line 202 upon the application of a positive read current thereto.

If the memory cell 214 has a logical "1" stored therein, the read voltage on line 202 will appear as illustrated by the solid line 248 and if the memory cell 214 has a logical "0" stored therein the voltage on line 202 will appear as illustrated by the dashed line 250. At $t_2$, if a logical "1" has been read, the read current is terminated because the positve potential on the capacitor 224 will still remain by virtue of the positive read current applied to the row line 202. However, if a logical "0" is read, a negative current is applied at $t_2$ and terminates at $t_3$. The negative current causes the capacitor 224 to be charged in the negative direction to restore the voltage stored therein to the proper logical "0" level.

Figure 12A:
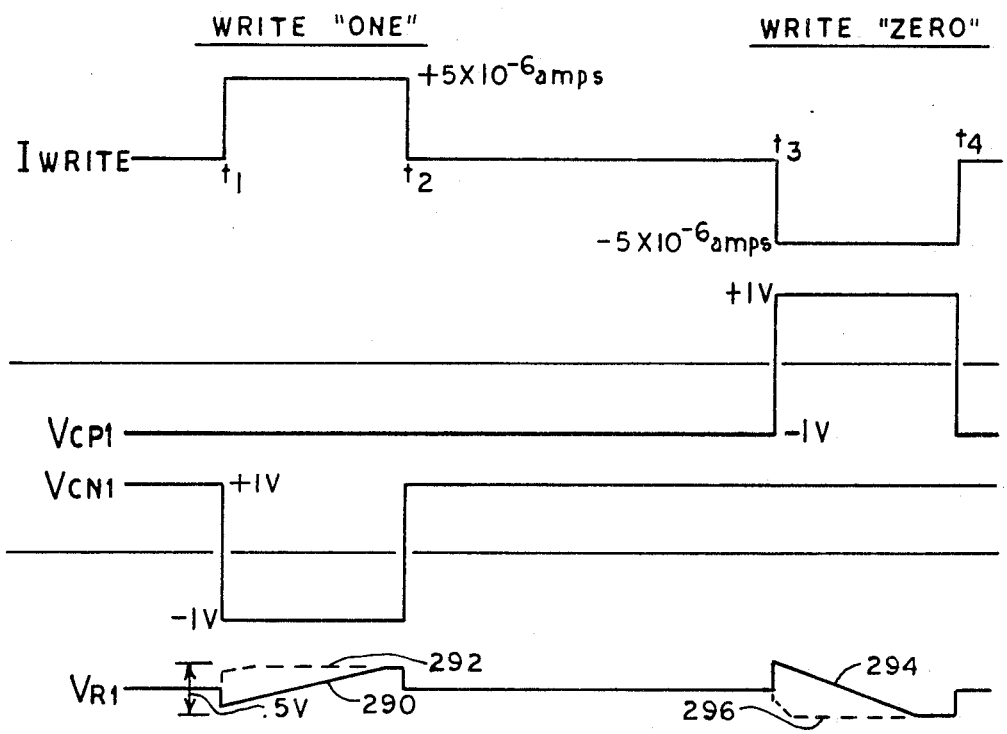
FIG. 12A is a series of waveforms associated with an alternate method of writing into one of the memory locations of the matrix of FIG. 10.

Referring now to FIG. 12A, the waveforms there shown illustrate a different manner in which a logical "1" or a logical "0" can be written into the memory cells of FIG. 10. If a logical "1" is to be written into memory cell 214 at $t_1$, a −1 volt is applied to address line 206, a −1 volt is applied to address line 210, and a positive write current is applied to the row address line 202. As a result of the foregoing, the diode will be forward biased to permit the charging of the capacitor 224 in a positive direction and diode 226 will be back biased. If the memory cell 214 had previously not been written into or had a logical "0" stored therein, the voltage on the row address line 202 will follow the solid line 290. If memory cell 214 had previously been written with a logical "1," the voltage at the row address line 202 would follow the dashed line 292. As can be noted in FIG. 12A, the voltage on the row address line 202 is permitted to rise to a voltage of 0.250 volts which denotes a logical "1." At $t_2$ the voltage applied to the column address line 210 is reversed in polarity to back bias diode 230 leaving a positive charge remaining on the capacitor 224 for storing a logical "1" therein.

To write a logical "0" into memory cell 214 at $t_3$, a +1 volt is applied to the column address line 206, a +1 volt is applied to the column address line 210, and a negative write current is applied to the row address line 202. As a result, diode 226 is forward biased to permit the capacitor 224 to be charged in a negative direction to −0.250 volts for storing a logical "0" in memory cell 214 and the diode 230 will be back biased. If memory cell 214 had previously not been written into or had been written with a logical "1" the voltage at the row line 202 will follow the solid line 294. If memory cell 214 had been written with a logical "0," the voltage at line 202 would follow the dashed line 296.

As can be seen from the foregoing, a logical "1" is again represented by a +0.250 volts and a logical "0" is again represented by a −0.250 volts. As a result, the difference in voltage between the two logic levels is 0.5 volts which is readily readable for determining the logic state of a memory cell.

During the writing into of the memory cell 214, all of the column address lines not associated therewith have voltages applied thereto for back biasing the diodes associated with the memory cells corresponding to the other column address lines. These diodes can be back biased by applying a −1 volt to one column address line and a +1 volt to the other address line to assure that the diodes are back biased.

Figure 12B:
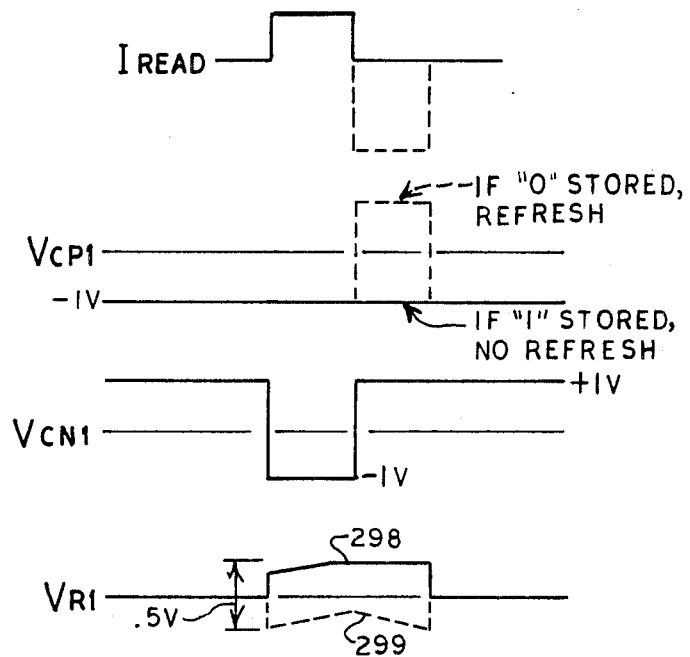
FIG. 12B is a series of waveforms associated with an alternate method of reading and refreshing one of the memory locations of the matrix of FIG. 10.

FIG. 12B illustrates a read-refresh cycle for the typical memory cell 214 of FIG. 10. A positive read current is applied to the line 202 while simultaneously addressing the cell 214 by applying a negative one volt potential to the line 206 to reverse bias the diode 226, and a negative one volt potential to the line 210 to forward bias the diode 230. If a logical "1" had previously been written into the cell 214, the measurable voltage on the read current line 202 will approach 0.25 volt as indicated by a solid line 298 in the lower graph of FIG. 12B. However, if a logical "0" had previously been written into the cell 214, the sensed voltage on the line 202, as indicated by a dashed line 294 in FIG. 12B, would be about 0.25 volt negative.

For refresh purposes only, in the event that the cell 214 contains a logical "0," the read current $I_{READ}$ is reversed, with twice its original magnitude, while the voltage applied to the lines 206 and 210 correspond to +1 volts. In this condition, the diode 226 is forward biased and the diode 230 is reversed biased with the result that the charge on the capacitor 224 is restored to its condition indicating the presence of a logical "0." The second section of the dashed line 299 illustrating the voltage on the line 202, during this refresh phase, illustrates the effect of the charge being restored onto the capacitor 224.

As in the previous embodiments, each memory cell having column address lines 206 and 210 in common which are to be written with a logical "0", can be written in parallel. Likewise, each memory cell having column address lines 206 and 210 in common which are to be written with a logical "1", can be written in parallel. However, since different voltages are applied to the column address lines 206 and 210 during the writing of a logical "0" and logical "1", the logical "0's" and logical "1's" must be written into the memory cells serially. Although this takes more time to accomplish the writing of the logic levels into the memory cells, it does reduce the overall current within the memory during the writing cycles.

Figure 13:
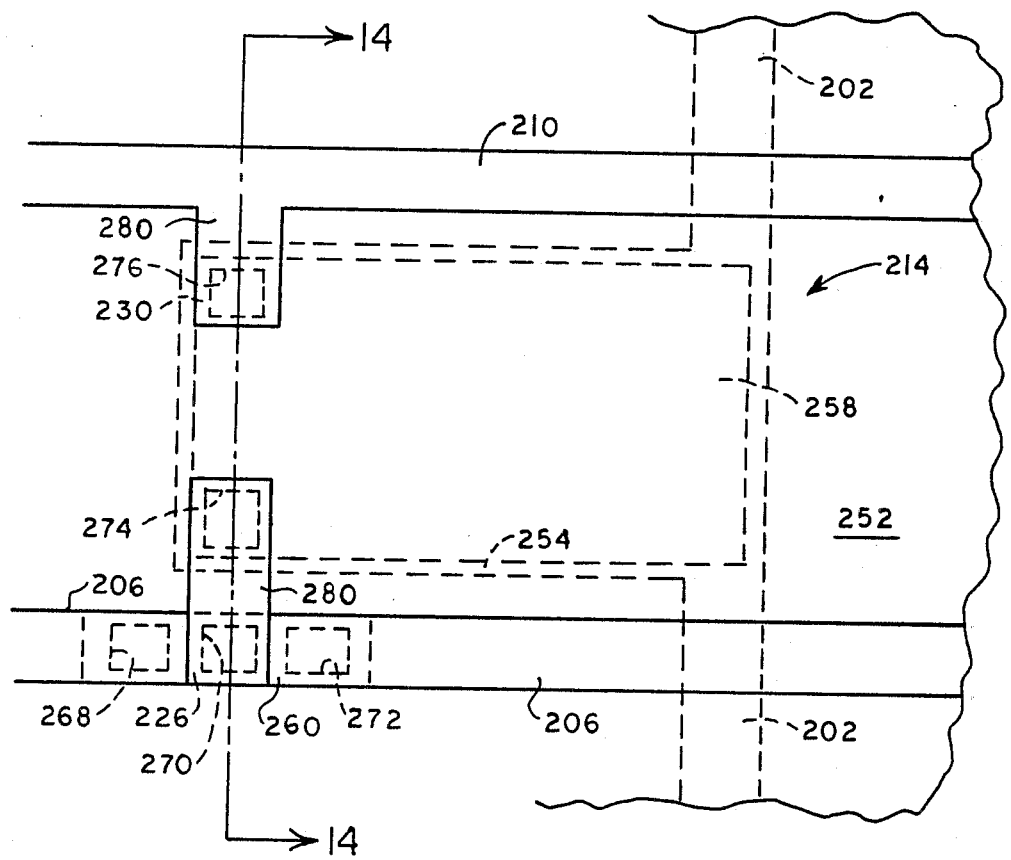
FIG. 13 is a top plan view of a memory location embodying the present invention corresponding to one of the memory locations illustrated in FIG. 10.
Figure 14:
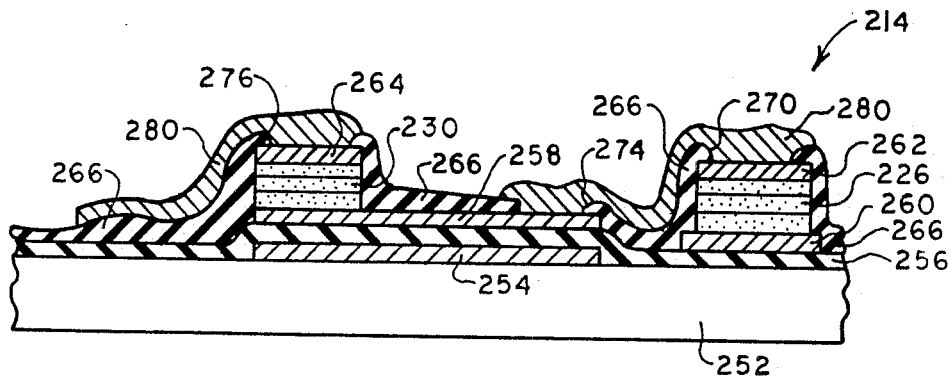
FIG. 14 is a view in section taken along line 14—14 of FIG. 13.

Referring now to FIGS. 13 and 14, they illustrate one structural form that the memory cell 214 can take in accordance with this preferred embodiment. The memory cell 214 includes an insulative substrate 252 upon which a first conductive electrode 254 is formed for forming the first electrode of the capacitor 224. Also formed with the electrode 254 is the row address line 202. After the electrode 254 and address line 202 are formed, an insulating layer 256 of silicon dioxide is formed thereover.

The second electrode 258 is then formed over the electrode 254 for forming the other electrode of the capacitor 224 along with a conductive pad 260. The diodes 226 and 230 are then formed over the conductive pad 260 and the electrode 258 respectively. The diodes 226 and 230 are preferably p-i-n diodes formed from amorphous semiconductor alloys as previously described. The diodes 226 and 230 are completed with the forming of a metallic layer 262 and 264 thereover for forming a good ohmic contact with the diode.

A layer of insulating material 266 is then formed over the partially completed memory cell and is patterned to form a plurality of openings or vias 268, 270, 272, 274, and 276. The vias 268 and 272 expose portions of the metal pad 260, the via 270 exposes the top metal 262 of diode 226, the via 274 exposes a portion of the top electrode 258, and the via 276 exposes the top portion of the diode 230.

To complete the memory cell 214, a top metal layer is formed and patterned to interconnect the diodes 226 and 230 with the electrode 258, to form the column address lines 206 and 210, and to make electrical connection between the column address line 206 and the metal pad 260 through the vias 268 and 272. As a result of the foregoing, a structure is completed which corresponds to the schematic circuit diagram of memory cell 214 as illustrated in FIG. 10.

Other charge storage means are also within the scope of the present invention. For example, for each of the embodiments disclosed herein, a charge storage material, such as a silicon nitride ($Si_xNy$) layer having a thickness of about 450 Angstroms can be substituted for the capacitor dielectric. Such a material has demonstrated the existence of deep traps which are capable of storing either positive or negative charge injected therein. Such materials are particularly desirable because the charge can be stored therein for long periods of time making reading and refreshing at less frequent intervals possible. The injection of the stored charge can also be made more efficient by providing a layer of semiconductor material immediately adjacent to the charge storage material. The charge storage time can also be considerably increased by providing a thin (less than 50 Angstroms) layer of insulating material between the charge storage material and the adjacent semiconductor. The insulating layer can be, for example, 40 Angstroms of silicon oxide.

In connection with the above noted embodiment using a silicon nitride layer, a write voltage would be applied to that layer to facilitate the injection of carriers into the deep traps. For a silicon nitride layer with a thickness in a range of 150–450 Angstroms, a 5 to 15 volt write voltage would be sufficient depending upon the thickness of the silicon nitride layer. A storage location constructed with a silicon nitride storage layer could be read using any of the previously disclosed read techniques.

Figure 15:
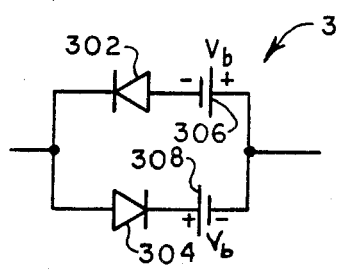
FIG. 15 is a schematic diagram of an alternate embodiment of a bidirectional threshold device in accordance with the present invention.

FIGS. 15–19 illustrate yet another embodiment of the present invention. FIG. 15 illustrates a bidirectional threshold element 300 with cross-coupled threshold diodes 302 and 304 coupled respectively to potential sources 306 and 308. The element 300 is a form of diode ring with the potential sources 306 and 308 differentially biasing the branches of the ring diode or element 300.

Figure 16:
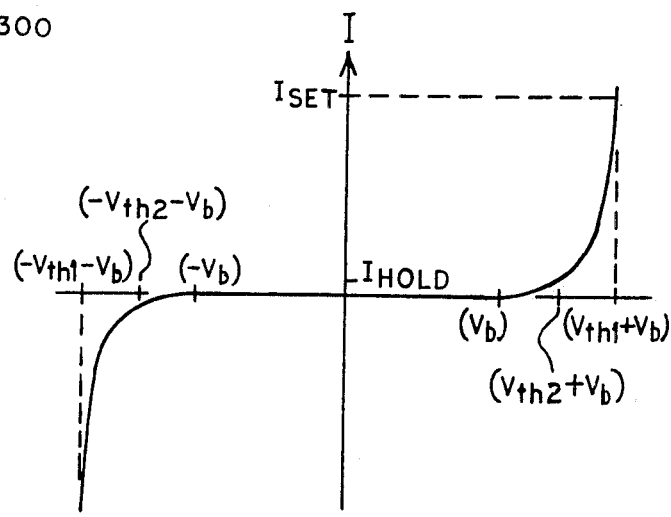
FIG. 16 is an idealized transfer function of the bidirectional threshold device of FIG. 15.

FIG. 16 illustrates an idealized transfer function for the threshold element 300. The threshold voltages $V_{th2}$, $-V_{th2}$, $V_{th1}$, $-V_{th1}$ have, in FIG. 16, each been increased by an amount $V_b$. While in the present embodiment the potential sources 306 and 308 have been illustrated as having the same absolute value, $V_b$, it will be understood that further embodiments of the present invention might include systems where it would be preferred to make the absolute values of the potential sources 306 and 308 different.

An advantage that results from inserting the potential sources 306 and 308 into the threshold element 300 is that the resultant memory cell can be driven with larger addressing voltages. Further, the output voltages will be greater, with a greater difference between the sensed output voltages corresponding to the process of a logical "1" or a logical "0." The noise immunity of the resultant memory cell will thus be enhanced.

Figure 17:
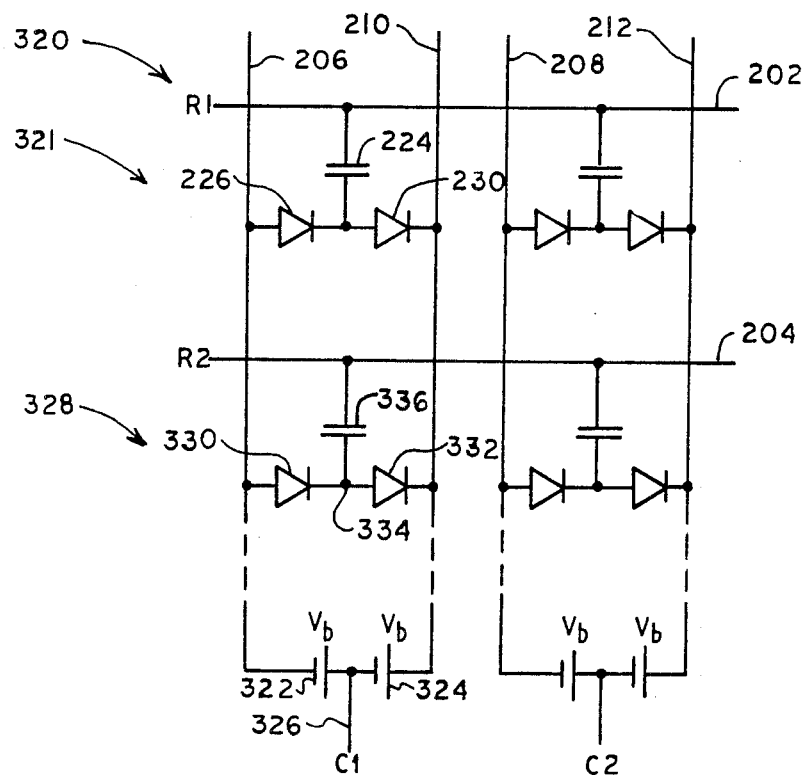
FIG. 17 is a schematic diagram of a section of a memory matrix incorporating the bidirectional threshold device of FIG. 15.

FIG. 17 illustrates an array 320 which is a modified form of the memory array or matrix 200 of FIG. 10. The array 320 includes the row address lines 202 and 204 and the column address lines 206, 208, 210 and 212 from the array 200. The array 320 also includes the capacitor 224 and the diodes 226 and 230 from the array 200 of FIG. 10. The array 320 includes the bidirectional threshold element 300 illustrated in FIG. 15. In FIG. 17 the potential sources 322 and 324 which are coupled to an address line 326 form a threshold element incorporating the diodes 226 and 230.

The structure of the array 320 is advantageous in that the potential sources 322 and 324 are shared among a plurality of bidirectional threshold elements such as the threshold element incorporating the diodes 226 and 230 and a threshold element 328. The element 328 includes a pair of diodes 330 and 332. The diodes 330 and 332 are coupled at a node 334 to a storage capacitor 336.

As a result of the inclusion of the potential sources 322 and 324 in the array of FIG. 17, the ratio of $V_{th1}$, $V_{on}$, to $V_{th2}$, $V_{off}$, can be substantially reduced thus providing the enhanced signal to noise immunity referred to above. If $V_{th1}$ is normally on the order of 1 volt and $V_{th2}$ is on the order of 0.5 volt, then without the additional potential sources 306 and 308:

$$\frac{V_{on}}{V_{off}} = \frac{V_{th1}}{V_{th2}} = 2$$

However, with the addition of the potential sources 306 and 308 or 322 and 324 the ratio can be reduced as illustrated in Table 1.

TABLE 1

| $V_b$ | $V_{on}/V_{off}$ |
| --- | --- |
| 1.0 | 1.33 |
| 1.5 | 1.25 |
| 2.0 | 1.20 |

Figure 18:
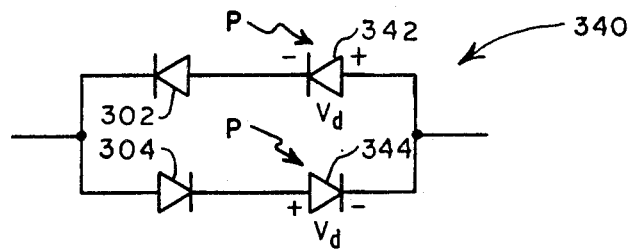
FIG. 18 is a schematic diagram of an alternate embodiment of the bidirectional threshold device of FIG. 15.

FIG. 18 illustrates an embodiment 340 of the threshold element 300. The element 340 includes the diodes 302 and 304 as in FIG. 15. However, the potential sources 306 and 308 of FIG. 15 are in FIG. 18 implemented as photovoltaic diodes 342 and 344. Such diodes can be implemented as deposited amorphous silicon alloy diodes as disclosed in the above-noted U.S. Pat. No. 4,226,898.

The photovoltaic diodes 342, 344 will, in response to photons of incident light P, generate potentials thereacross. The diodes 342 and 344 can be excited by incident light directed at the array 320.

In the embodiment of FIG. 18, the value $V_d$ of the photovoltaic voltage across the diode 342 or the diode 344 changes as the current through diode 302 or the current through the diode 304 increases. When the current in the diode 302 or the diode 304 is very small, the voltage across the diode 342 or the diode 344 is essentially equal to the open circuit photovoltaic voltage thereof. This voltage is about 0.8 volts. As the current through the diode 302 or the diode 304 increases, the voltage across the diode 342 and the voltage across the diode 344 each increase on the order of 0.2 volt to 1 volt.

In the embodiment of FIG. 18, assuming $V_{th1}$ corresponds to 1 volt and $V_{th2}$ corresponds to 0.5 volt:

$$\frac{V_{on}}{V_{off}} = \frac{.8 + .2 + 1}{.8 + .5} = \frac{2}{1.3} = 1.53$$

Figure 19:
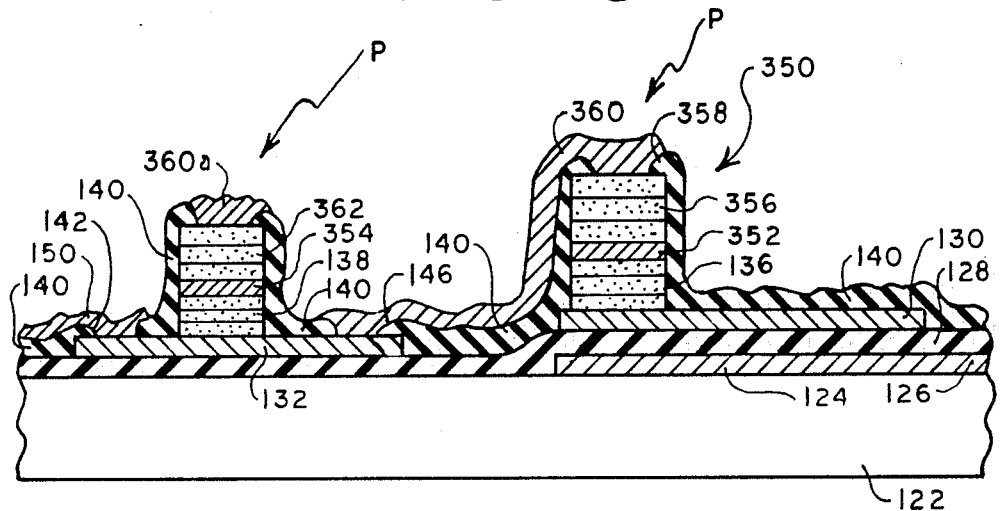
FIG. 19 is a view in section of a memory location incorporating the bidirectional threshold element of FIG. 18 in accordance with the present invention.

FIG. 19 is a sectional view of a memory cell 350, having a similar equivalent circuit as the memory cells of FIG. 2, but incorporating photo diodes in series with the threshold elements as illustrated in FIG. 18. The memory cell 350 of FIG. 19 includes many structural elements previously illustrated in FIG. 9. As a result, corresponding identification numerals are used on corresponding elements in FIG. 19 as were originally used in FIG. 9.

In the memory cell 350 of FIG. 19, threshold diodes 136 and 138 correspond to the threshold diodes 302 and 304 of the bidirectional threshold element 340 of FIG. 18. Deposited over an upper end of each of the diodes 136 and 138 is an opaque metal layer 352 and an opaque metal layer 354. As will become more apparent subsequently, the importance of the opaque metal layers 352 and 354, which might be chromium or tantalum, lies in the fact that they block incident radiation P which might be directed at the memory cell 350.

Formed above the opaque metal layer 352 is a diode 356 which is coupled in series, via the metal layer 352 to the diode 136. The series combination of the diodes 136 and 356 corresponds to the series combination of the diodes 302 and 342 of FIG. 18. The diode 356 can be a deposited amorphous silicon alloy photovoltaic diode in accordance with the disclosure of the previously noted U.S. Pat. No. 4,226,898.

The insulating layer 140 illustrated in FIG. 19 which has been deposited around and over the series coupled diodes 356 and 136 has an opening or via 358 formed therein. The via 146 previously illustrated in FIG. 9 is also formed in the insulating layer 140. A layer 360 of a transparent conducting material, such as indium tin oxide, is deposited coupling the upper end of the diode 356, through the via 358, to the conductive layer 132, through the via 146. The conductive transparent layer 360 permits photons of incident radiation P to pass therethrough and impinge upon the diode 356.

As disclosed in the above-noted U.S. Pat. No. 4,226,898, the diode 356 can be operated as a photovoltaic diode which will generate a potential in response to photons of incident radiation. The potential generated by the diode 356 in response to the photons of incident radiation P corresponds to the potential $V_d$ generated by the photovoltaic diode 342 of FIG. 18.

In a similar fashion, a second photovoltaic diode 362 is formed in FIG. 19 deposited over the opaque conductive layer 354. The series coupled combination of the diode 138 and the photovoltaic diode 362 correspond to the series coupled combination of the diode 304 and the photovoltaic diode 344 of FIG. 18. A further deposited layer $360_a$ of a transparent conductor, indium tin oxide for example, couples an upper end of the photovoltaic diode 362 to the plate 130 of the storage capacitor of the memory cell 350. As is the case with the diode 356, photons P of incident radiation P pass through the indium tin oxide layer $360_a$ and excite the photovoltaic diode 354 which in turn generates the potential $V_d$ corresponding to the potential generated across the photovoltaic diode 344 of FIG. 18.

It will be understood in connection with the embodiment of the storage cell 350 of FIG. 19 that under normal operating conditions, the appropriate level of photons of incident radiation P would be provided such that the potentials generated by the photovoltaic diodes 356 and 362 would have the expected values. It will also be understood that it is within the scope of the present invention to incorporate other electronic devices, which might be deposited devices, which could generate a corresponding value of electrical potential other than the above illustrated photovoltaic diodes.

Figure 20:
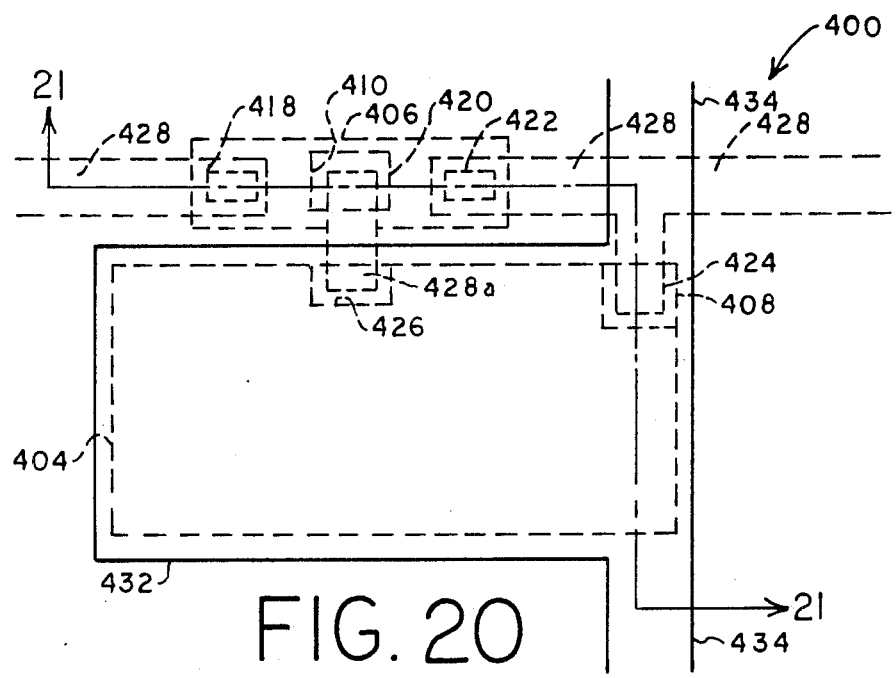
FIG. 20 is a top view of a liquid crystal embodying the present invention.
Figure 21:
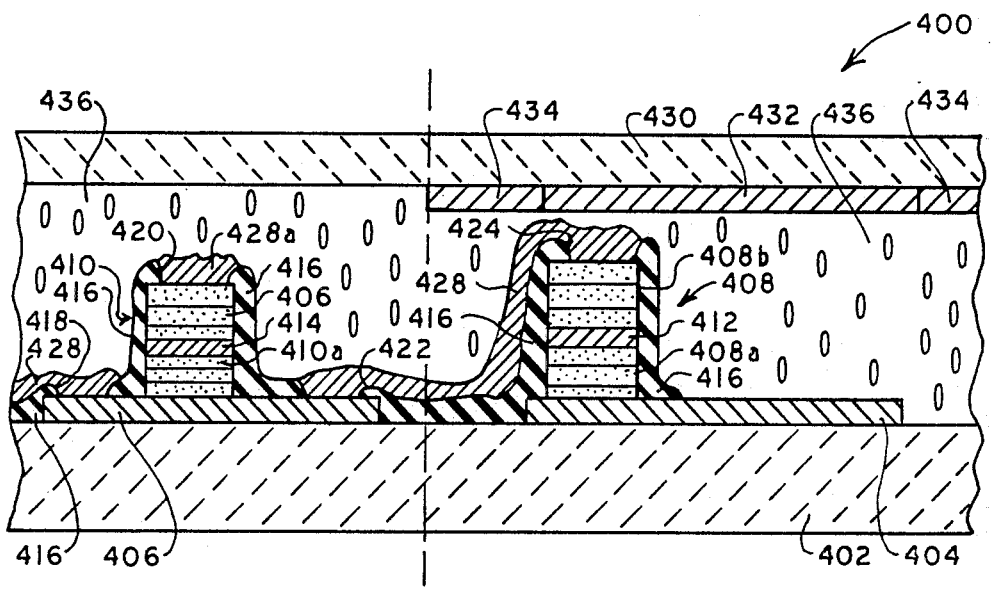
FIG. 21 is a cross-sectional view taken along line 21—21 of FIG. 20.
Figure 22:
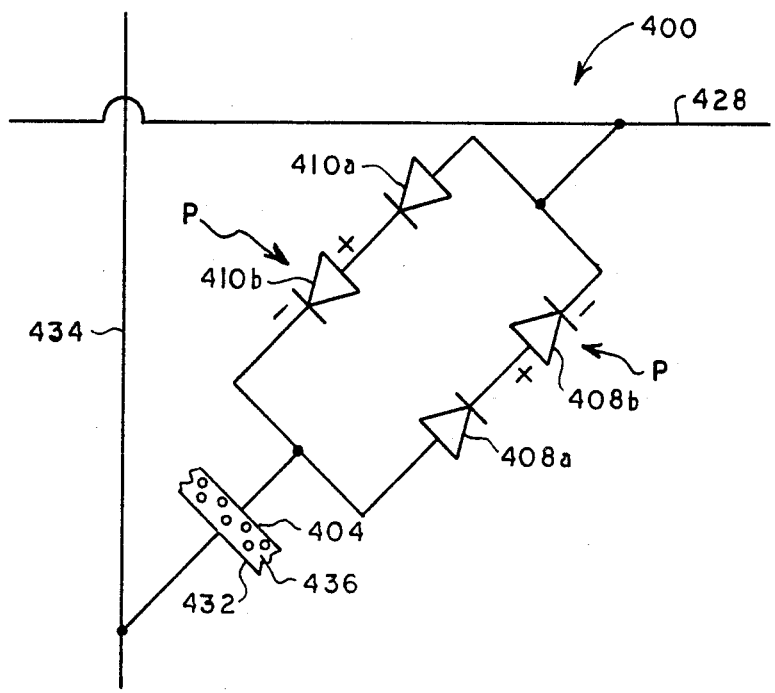
FIG. 22 is an equivalent circuit diagram of the structure illustrated in FIGS. 20 and 21.

Referring now to FIGS. 20 and 21, they illustrate a light influencing display, and more particularly a liquid crystal display pixel 400 having a differentially biased ring diode structure embodying the present invention. The ring diode structure is formed from two pairs of p-i-n diodes which are coupled together as illustrated in FIG. 22. The liquid crystal display pixel 400 is formed on a transparent insulative substrate 402, such as glass, for example. Formed on the glass substrate 402 is a first pixel electrode 404 formed from a metal such as chromium for a display which is to operate in the reflective mode, or a transparent conductor such as indium tin oxide for a display which is to operate in the transmissive mode. Formed with the electrode 404 is an elongated conductive pad 406 which can also be formed from chromium, for example. Formed on the electrode 404 are a first pair of diodes 408 comprising diodes $408a$ and $408b$ and formed on the metal pad 406 are a second pair of diodes 410 comprising diodes $410a$ and $410b$. The diode pairs 408 and 410 are preferably formed during the same deposition process and comprise a p-type region, an intrinsic region, and an n-type region. The diode pairs 408 and 410 are also preferably formed from deposited semiconductor materials and most preferably amorphous semiconductor alloys as disclosed, for example, in the aforementioned U.S. Pat. No. 4,226,898. The lower diodes $408a$ and $410a$ are separated from the upper diodes $408b$ and $410b$ respectively by metal layers 412 and 414 formed from chromium, for example, which shield the lower diodes from incident light.

The pixel 400 further includes insulating layer regions 416. The insulating layer regions 416 can be formed from any deposited insulator such as silicon oxide or silicon nitride. During the photolithography step in forming the regions 416, openings or vias 418, 420, 422, 424, and 426 can be formed therein to expose surface portions of the diodes and the conductive layers to allow a top transparent conductive layer having separate regions 428, 428a to interconnect the diodes and the electrode 404 to form the ring diode structure in series with the electrode 404. The top conductive layer 428 not only serves to interconnect the diodes and the electrode 404, but in addition can also be used to form the row address lines. Also, since the conductive layer 428 is transparent, incident light is permitted to impinge upon the upper diodes 408b and 410b.

The pixel 400 further includes a top insulative transparent plate 430 formed from glass, for example. The plate 430 carries on its inner surface a second pixel electrode 432 and a column address line 434. The electrode 432 and column address line 434 can be formed from a transparent conductor such as indium tin oxide. The second electrode 432 is preferably the same size and shape as the first electrode 404 and aligned therewith.

To complete the pixel 404, a light influencing material 436 such as liquid crystal material is disposed between the substrate 402 and the plate 430. The liquid crystal material can be, for example, nematic liquid crystal material. By the term "light influencing material" is meant any material which emits light or can be used to selectively vary the intensity, phase, or polarization of light either being reflected from or transmitted through the material.

FIG. 22 illustrates an equivalent circuit diagram of the pixel 400 of FIGS. 20 and 21. As can there be noted, the pixel includes the column address line 434 and the row address line 428. The column address line 434 is coupled to the second pixel electrode 432 and the row address line 428 is coupled to the diodes 408b and 410a. The diodes 408b and 410a are coupled in series with diodes 408a and 410b respectively and to the row address line 428. The diodes 408a and 410b are also coupled to the first pixel electrode 404. Finally, disposed between the electrodes 404 and 432 is the liquid crystal material 436.

The diodes 408a, 408b, 410a, and 410b provide isolation means for the pixel 400 in the form of a differentially biased ring diode when the pixel 400 is exposed to light indicated at P. The light is incident on diodes 408b and 410b which serve as photovoltaic devices to back bias diodes 408a and 410a respectively. As a result, increased drive voltages are required to operate the pixel 400 by virtue of the back biasing photodiodes. This is advantageous because the threshold for operating a display comprising a plurality of such pixels is sharpened as previously explained with respect to the dynamic memory embodiments disclosed herein.

It will be understood that the present invention includes various alternate structures. For example, the bidirectional threshold devices may be formed as diode rings including p-n junction diodes. It will be understood that any threshold device having a transfer function generally corresponding to those of FIG. 3A and FIG. 3B is within the scope of the invention. The threshold elements may be formed of amorphous silicon or germanium alloys. Additionally, it is within the scope of the invention to form capacitors in alternate ways. For example, if desired, a capacitor could be formed using a reverse biased diode and incorporated into the memory cell of the present invention.

We claim:

1. A light influencing display comprising: a plurality of pixels, at least one pixel including a pair of electrodes, at least one of said electrodes being light transmissive; isolation means coupled to one of said electrodes to enable the selective application of driving potentials across said electrodes; and light influencing material disposed between said electrodes; said isolation means including bidirectional threshold means for establishing first and second threshold voltages of opposite polarity and including a first threshold device having a first threshold voltage, and a second threshold device having a second threshold voltage, said first and second threshold devices being coupled together in a ring to establish first and second threshold voltages of opposite polarity; and first and second photovoltaic potential sources coupled in series with said first and second threshold devices respectively, said first threshold device being in series with said first photovoltaic potential source in the ring and said second second threshold device being in series with said second photovoltaic potential source in the ring for back biasing said first and second threshold devices and increasing the absolute magnitude of said first and second threshold voltages.

2. A display as defined in claim 1 wherein said light influencing material is liquid crystal material.

3. A display as defined in claim 2 wherein said liquid crystal material comprises a nematic liquid crystal material.

4. A display as defined in claim 1 wherein said light transmissive electrode comprises indium tin oxide.

5. A display as defined in claim 1 wherein said threshold devices are formed from a deposited semiconductor material.

6. A display as defined in claim 5 wherein said deposited semiconductor material comprises an amorphous semiconductor alloy.

7. A display as defined in claim 6 wherein said amorphous semiconductor alloy includes silicon.

8. A display as defined in claim 6 wherein said amorphous semiconductor alloy includes fluorine.

9. A display as defined in claim 6 wherein said amorphous semiconductor alloy includes hydrogen.

10. A display as defined in claim 1 wherein said threshold devices comprise diodes.

11. A display as defined in claim 10 wherein each said diode comprises a first doped region, a substantially intrinsic region, and a second doped region opposite in conductivity with respect to said first doped region.

12. A display as defined in claim 1 wherein said photovoltaic potential sources are formed from deposited semiconductor material.

13. A display as defined in claim 12 wherein said deposited semiconductor material comprises an amorphous semiconductor alloy.

14. A display as defined in claim 13 wherein said amorphous semiconductor alloy includes silicon.

15. A display as defined in claim 14 wherein said amorphous semiconductor alloy further includes hydrogen.

16. A display as defined in claim 14 wherein said amorphous semiconductor alloy further includes fluorine.

17. A display as defined in claim 12 wherein said photovoltaic devices comprise a first doped semiconductor layer, an intrinsic semiconductor layer, and a second doped semiconductor layer.

18. A display as defined in claim 17 wherein said first and second doped semiconductor layers are of opposite conductivity.

* * * * *